(12) United States Patent
Mun et al.

(10) Patent No.: US 11,469,169 B2
(45) Date of Patent: Oct. 11, 2022

(54) HIGH VOLTAGE DECOUPLING CAPACITOR AND INTEGRATION METHODS

(71) Applicant: GLOBALFOUNDRIES Singapore Pte. Ltd., Singapore (SG)

(72) Inventors: Bong Woong Mun, Singapore (SG); Jeoung Mo Koo, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 11 days.

(21) Appl. No.: 17/100,950

(22) Filed: Nov. 23, 2020

(65) Prior Publication Data
US 2022/0165658 A1  May 26, 2022

(51) Int. Cl.
*H01L 23/522* (2006.01)
*H01L 23/528* (2006.01)
*H01L 49/02* (2006.01)

(52) U.S. Cl.
CPC ...... *H01L 23/5223* (2013.01); *H01L 23/5226* (2013.01); *H01L 23/5286* (2013.01); *H01L 28/60* (2013.01)

(58) Field of Classification Search
CPC ............ H01L 23/5223; H01L 23/5226; H01L 23/5286; H01L 28/60

USPC ......................................................... 257/532
See application file for complete search history.

(56) References Cited

U.S. PATENT DOCUMENTS

| | | | |
|---|---|---|---|
| 6,638,813 B1* | 10/2003 | Tzeng | H01L 28/60 |
| | | | 257/E21.549 |
| 8,114,753 B2 | 2/2012 | El-Kareh et al. | |
| 8,957,500 B2 | 2/2015 | Dubois et al. | |
| 9,299,697 B2 | 3/2016 | West et al. | |
| 2005/0179077 A1 | 8/2005 | Schnitt et al. | |
| 2008/0006866 A1* | 1/2008 | Lee | H01L 27/0629 |
| | | | 257/E21.396 |

\* cited by examiner

*Primary Examiner* — Tu-Tu V Ho
(74) *Attorney, Agent, or Firm* — David Cain

(57) ABSTRACT

A capacitor is provided. The capacitor includes a first conductive layer in a first isolation region in a substrate and a plurality of dielectric layers over the first isolation region. The plurality of dielectric layers may include inter layer dielectric (ILD) and inter metal dielectric (IMD) layers. The first conductive layer is a bottom plate of the capacitor. A second conductive layer is arranged over the plurality of dielectric layers, whereby the second conductive layer is a top plate of the capacitor and at least partially overlaps with the first conductive layer.

20 Claims, 6 Drawing Sheets

HIGH VOLTAGE DECOUPLING CAPACITOR AND INTEGRATION METHODS

FIELD OF THE INVENTION

The disclosed embodiments relate generally to isolation structures in semiconductor devices, and more particularly, to a decoupling capacitor capable of operating at high voltages and methods of manufacturing the same.

BACKGROUND

An electrical system typically contains several electrical circuits that may communicate with each other but may operate at different voltages. For example, a microwave oven operating at 110V/220V alternating current (AC) may produce up to 2800V inside it. The high voltage must be isolated from a user or other electrical circuits within the system while still allowing information to be exchanged between the different electrical circuits. Galvanic isolation may be used to prevent direct current from flowing between the different electrical circuits while still allowing signals or energy to be exchanged for communication between the different electrical circuits.

A decoupling capacitor may be used to galvanically isolate different electrical circuits of an electrical system to prevent stray currents from flowing. Physical space constraints may make it difficult to implement a decoupling capacitor having a high enough breakdown voltage in an integrated circuit. For example, the decoupling capacitor may be fabricated in the metallization layers or the back end of line (BEOL) layers of the integrated circuit. However, since large voltage differences may arise between the isolated electrical circuits, possibly on the order of several kilovolts, a decoupling capacitor is required that has a higher breakdown voltage than can be manufactured using this technique. Thus, there is a need for an improved decoupling capacitor to overcome the challenges mentioned above.

SUMMARY

In an aspect of the present disclosure, a capacitor is provided. The capacitor comprises a first conductive layer in a first isolation region in a substrate. A plurality of dielectric layers is arranged over the first isolation region. A second conductive layer is arranged over the plurality of dielectric layers, whereby the second conductive layer at least partially overlaps with the first conductive layer.

In another aspect of the present disclosure, a semiconductor device is provided. The semiconductor device comprises a substrate comprising an insulating layer and an active layer over the insulating layer. A first isolation region is arranged in the active layer and in the insulating layer. A second isolation region is arranged in the active layer laterally adjacent to the first isolation region. A capacitor is provided. The capacitor comprises a first conductive layer in the first isolation region. The first conductive layer is a bottom plate of the capacitor. A plurality of dielectric layers is arranged over the first isolation region. A second conductive layer is arranged over the plurality of dielectric layers. The second conductive layer is a top plate of the capacitor and the second conductive layer at least partially overlaps with the first conductive layer.

In yet another aspect of the present disclosure, a method of fabricating a semiconductor device is provided. The method comprises providing a substrate comprising an insulating layer and an active layer over the insulating layer. A first isolation region is provided in the insulating layer and the active layer. A second isolation region is provided in the active layer, whereby the second isolation region is laterally adjacent to an upper portion of the first isolation region. A capacitor is provided. The capacitor comprises a first conductive layer arranged in the first isolation region. A plurality of dielectric layers is arranged over the first isolation region. A second conductive layer is arranged over the plurality of dielectric layers, whereby the second conductive layer at least partially overlaps with the first conductive layer Numerous advantages may be provided in the embodiments described below. The embodiments provide a decoupling capacitor capable of high voltage operation. The decoupling capacitor may be fabricated with the existing substrate and metallization stacks, without the need of additional metallization layers. A first conductive layer of the decoupling capacitor may be integrated into an isolation region in the substrate layer thereby freeing up space for overlying metallization stacks. An upper portion of the first isolation region is within a shallow trench isolation (STI) layer of an active layer. Thereby it does not take up additional lateral space in the device layout.

BRIEF DESCRIPTION OF THE DRAWINGS

The disclosed embodiments will be better understood from a reading of the following detailed description, taken in conjunction with the accompanying drawings.

Figure 1:
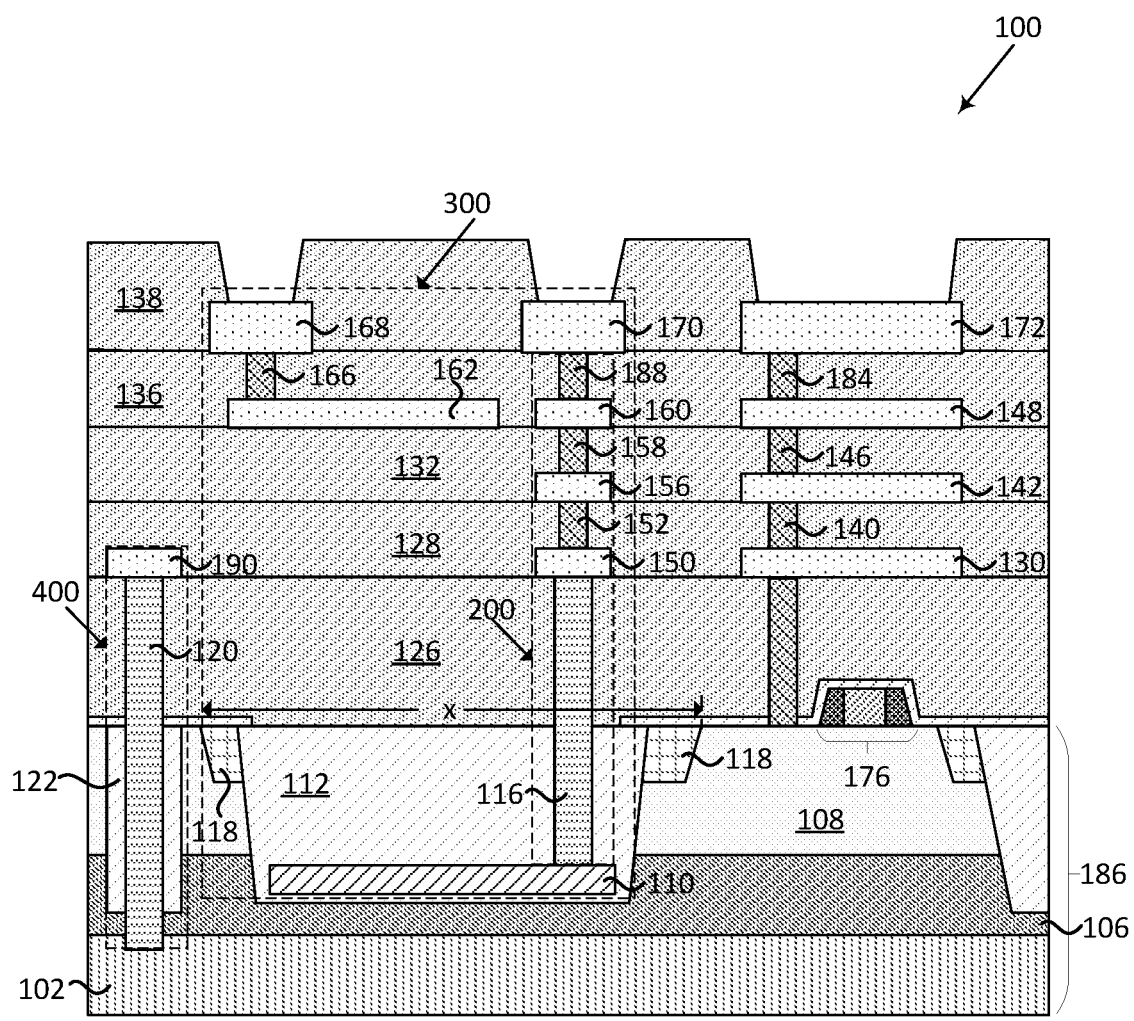
FIG. 1 is a semiconductor device with a decoupling capacitor, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 is a semiconductor device 100 with a decoupling capacitor 300, according to an embodiment of the disclosure. Referring to FIG. 1, the semiconductor device 100 may comprise a substrate 186 having an insulating layer 106 and an active layer 108 over the insulating layer 106. A first isolation region 112 may be arranged in the insulating layer 106 and in the active layer 108. A decoupling capacitor 300 may comprise a first conductive layer 110, the first isolation region 112, a plurality of dielectric layers 126, 128 and 132 and a second conductive layer 162. The first conductive layer 110 may be in the first isolation region 112 in one embodiment and may be in a lower portion of the first isolation region 112 in a preferred embodiment. The plurality of dielectric layers 126, 128 and 132 may be over the first isolation region 112. The second conductive layer 162 may be over the plurality of dielectric layers 126, 128 and 132. In one embodiment, the second conductive layer 162 may at least partially overlap with the first conductive layer 110. In another embodiment, the second conductive layer 162 may completely overlap with the first conductive layer 110. The decoupling capacitor 300 is encircled by a dashed outline. The first conductive layer 110 may serve as a bottom plate and the second conductive layer 162 may serve as a top plate of the decoupling capacitor 300. The first isolation region 112 and the plurality of dielectric layers 126, 128 and 132 may serve as dielectric layers of the decoupling capacitor 300 between the first conductive layer 110 and the second conductive layer 162.

A top surface of the first isolation region 112 may be at least level with a top surface of the active layer 108. A second isolation region 118 may be arranged laterally adjacent to an upper portion of the first isolation region 112, whereby the width x of the second isolation region 118 may be wider than the first isolation region 112. In one embodiment, the second isolation region 118 may be shallower than the first isolation region 112. In one embodiment, the first isolation region 112 may be a deep trench isolation (DTI) and the second isolation region 118 may be a shallow trench isolation (STI). The decoupling capacitor 300 does not take up additional lateral space in the semiconductor device 100 as an upper portion of the first isolation region 112 may be arranged in the second isolation region 118. In one embodiment, the second isolation region 118 may at least partially surround an upper portion of the first isolation region 112. In another embodiment, the second isolation region 118 may completely surround an upper portion of the first isolation region 112. The first isolation region 112 may be made of a suitable dielectric material, for example high density plasma (HDP) silicon dioxide ($SiO_2$) or any other suitable dielectric materials. The second isolation region 118 may be made of a suitable dielectric material, for example borophosphosilicate glass (BPSG), tetraethyl orthosilicate (TEOS), or any other suitable dielectric material. In one embodiment, the first isolation region 112 and the second isolation region 118 may be made of the same dielectric materials. In another embodiment, the first isolation region 112 and the second isolation region 118 may be made of different dielectric materials.

In one embodiment, the dielectric layer 126 may be inter layer dielectric (ILD) layer. The dielectric layers 128 and 132 may be inter metal dielectric (IMD) layers of a first 150 and second 156 metallization layers, respectively. The dielectric layer 126 may be made of a suitable dielectric material, for example, silicon dioxide ($SiO_2$), high density plasma (HDP) undoped silicate glass (USG), tetraethyl orthosilicate (TEOS), or any other suitable dielectric material. The dielectric layers 128 and 132 may be made of a suitable dielectric material, for example silicon dioxide, undoped silicate glass (USG), fluorinated silicate glass (FSG), tetraethyl orthosilicate (TEOS), or any other suitable dielectric material.

The first isolation region 112 may extend through the active layer 108 and an upper portion of the insulating layer 106. The first isolation region 112 may be arranged over a lower portion of the insulating layer 106. In one embodiment, the first conductive layer 110 may be arranged in a lower portion of the first isolation region 112. In another embodiment, the first conductive layer 110 may be arranged over a bottom surface of the first isolation region 112. In another embodiment, the first conductive layer 110 may be in an upper portion of the first isolation region 112. The substrate 186 may include a base layer 102 below the insulating layer 106. In one embodiment, the substrate 186 may be a silicon-on-insulator (SOI) substrate. The lower portion of the insulating layer 106 and the lower portion of the first isolation region 112 may be between the first conductive layer 110 and the base layer 102 to electrically isolate the first conductive layer 110 of the capacitor 300 from the base layer 102 of the substrate 186.

The decoupling capacitor 300 may include a first interconnect 200 over the first conductive layer 110, whereby the first interconnect 200 extends through a portion of the first isolation region 112 over the first conductive layer 110 and through a plurality of dielectric layers 126, 128, 132 and 136 to couple to a first bond pad 170. In an alternative embodiment, the first interconnect 200 may extend through a portion of the first isolation region 112 and through a plurality of dielectric layers 126, 128, 132 and 136 to couple to a metallization line. The decoupling capacitor 300 may include a second interconnect 166 over the second conductive layer 162, whereby the second interconnect 166 may extend through a dielectric layer 136 to couple to a second bond pad 168. In an alternative embodiment, the second interconnect 166 may extend through the dielectric layer 136 to couple to another metallization line. In one embodiment, the dielectric layer 136 may be an intermetal dielectric (IMD) layer. The first bond pad 170 and the second bond pad 168 may be connected to separate external input terminals or separate electrical circuits. The first interconnect 200 may comprise a plurality of contact pillars, 116, 152, 158 and 188, and metallization layers 150, 156 and 160. The second interconnect 166 may comprise a contact pillar.

A third interconnect 400 may extend from the base layer 102 through the insulating layer 106, the active layer 108 and the dielectric layer 126 for electrically biasing the base layer 102. In one embodiment, the third interconnect 400 may couple to a ground terminal to ground the base layer 102 of the substrate 186. The third interconnect 400 may comprise a contact pillar 120 and a metallization layer 190.

The embodiments described above provide semiconductor device 100 comprising a decoupling capacitor 300 with a high breakdown voltage due to thick dielectric layers between the first conductive layer 110 and the second conductive layer 162. In one embodiment, the first isolation region 112 may be made of a suitable dielectric layer, for example silicon dioxide ($SiO_2$). The portion of the first isolation region 112 over the first conductive layer 110 may have a thickness range of approximately 3 to 4 micrometers ($\mu m$). In one embodiment, the dielectric layers 126, 128 and 132 may be made of a suitable dielectric material, for example, silicon dioxide ($SiO_2$). The dielectric layer 126 may have a thickness range of approximately 0.55 to 0.95 micrometers ($\mu m$). The dielectric layers 128 and 132 may have a thickness range of approximately 0.6 to 1 micrometers ($\mu m$). Thereby, the total thickness of the dielectric layers between the first conductive layer 110 and the second conductive layer 162 ranges between 4 and 10 micrometers ($\mu m$). In one embodiment, the first 110 and second 162 conductive layers may be metallic layers.

Figure 2:
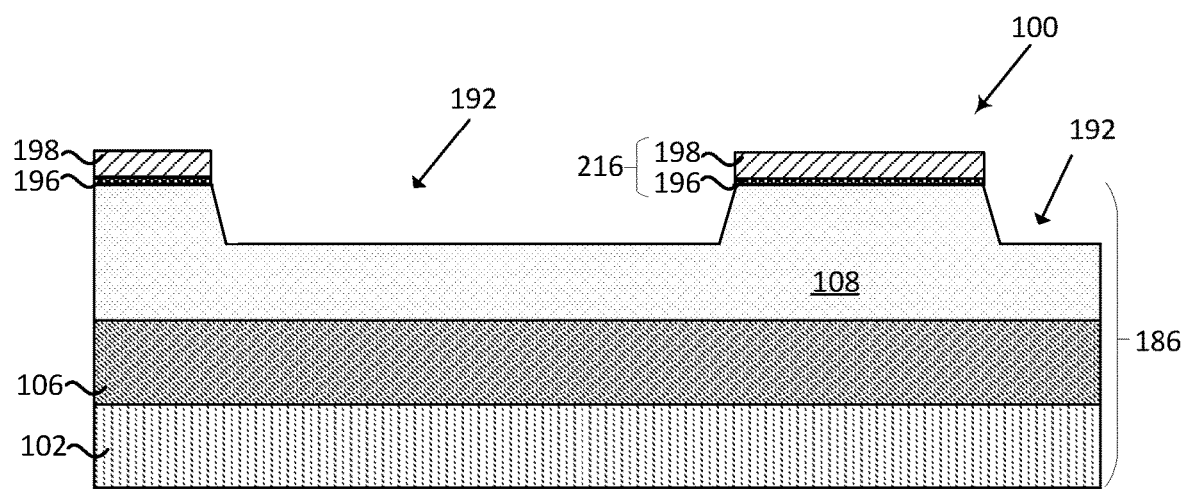
FIGS. 2 to 11 illustrate a fabrication process flow for the semiconductor device shown in FIG. 1, according to some embodiments of the disclosure.

FIGS. 2 to 11 illustrate a fabrication process flow for the semiconductor device 100 shown in FIG. 1, according to some embodiments of the disclosure. FIG. 2 is a partially completed semiconductor device 100 having an opening 192 in an active layer 108 of a substrate 186, according to an embodiment of the disclosure. Referring to FIG. 2, a suitable substrate 186, for example a silicon-on-insulator (SOI) substrate, may be provided. The substrate 186 may comprise a base layer 102, an insulating layer 106 over the base layer 102 and an active layer 108 over the insulating layer 106. The base layer 102 may comprise silicon. The insulating layer 106 may comprise silicon dioxide. The active layer 108 may comprise monocrystalline silicon. Sacrificial silicon dioxide 196 and silicon nitride 198 layers may be deposited over a top surface of the active layer 108 of the substrate 186 and patterned by a conventional photolithography process and a wet etch or dry etch process. The conventional photolithography process may include depositing a layer of photoresist over the sacrificial silicon dioxide 196 and silicon nitride 198 layers followed by exposure and developing to form a suitable photoresist pattern. A wet etch or dry etch process may be used to remove a portion of the sacrificial silicon dioxide 196 and silicon nitride 198 layers not covered by the photoresist pattern and leaving behind another portion of the sacrificial silicon dioxide 196 and silicon nitride 198 layers as a hard mask layer 216. The photoresist layer may subsequently be removed. A wet etch or dry etch process may be used to remove a portion of the active layer 108 not covered by the hard mask layer 216 to form an opening 192 in the active layer 108. The hard mask layer 216 may subsequently be removed.

Figure 3:
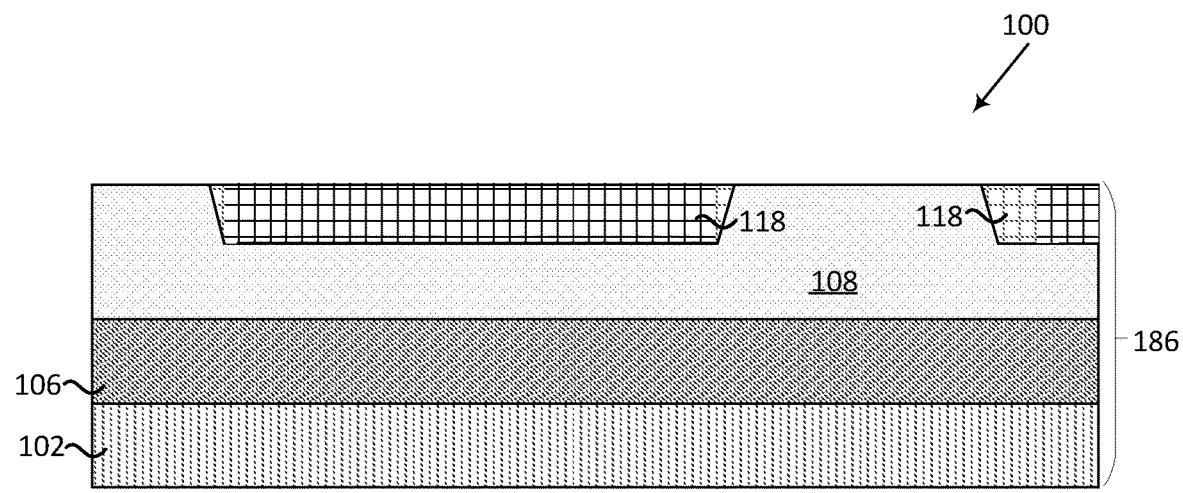

FIG. 3 is a partially completed semiconductor device 100 after formation of a second isolation region 118 in the active layer 108 of a substrate 186, according to an embodiment of the disclosure. Referring to FIG. 3, a layer of suitable dielectric material, for example silicon dioxide ($SiO_2$), may be deposited in the opening 192 by a suitable deposition process, for example atomic layer deposition (ALD), chemical vapor deposition (CVD), physical vapor deposition (PVD) or any other suitable deposition processes. A portion of the silicon dioxide layer over a top surface of the active layer 108 may be planarized by a suitable planarizing process, for example chemical mechanical planarization (CMP) to leave behind another portion of the silicon dioxide layer in the opening 192 thereby forming the second isolation region 118.

Figure 4:
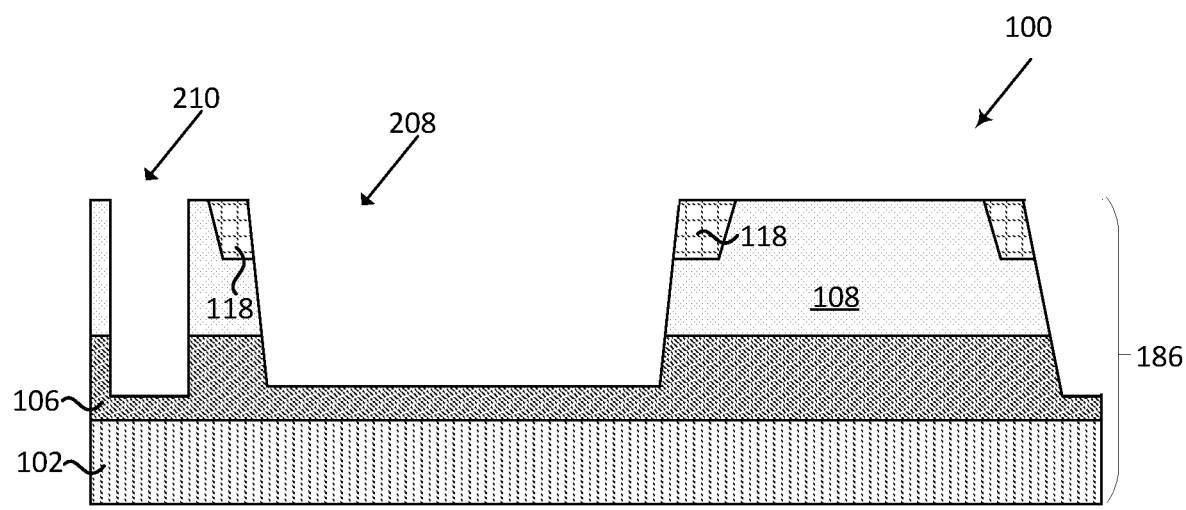

FIG. 4 is a partially completed semiconductor device 100 after formation of openings 208 and 210, according to an embodiment of the disclosure. Referring to FIG. 4, the opening 208 extends through the second isolation region 118, the active layer 108 and an upper portion of the insulating layer 106. The opening 210 extends through the active layer 108 and a portion of the insulating layer 106. The formation of the openings 208 and 210 may include deposition of a photoresist layer and patterning the photoresist layer by a conventional photolithography process to form a suitable photoresist pattern having an opening over a portion of the second isolation region 118 and over a portion of the active layer 108 of the substrate 186. A wet etch or dry etch process may be used to remove a portion of the second isolation region 118, a portion of the active layer 108 and a portion of the insulating layer 106 not covered by the photoresist pattern to thereby form the opening 208. Similarly, a wet etch or dry etch process may be used to remove a portion of the active layer 108 and a portion of the insulating layer 106 not covered by the photoresist pattern to thereby form the opening 210. The photoresist pattern may subsequently be removed after the etching processes.

Figure 5:
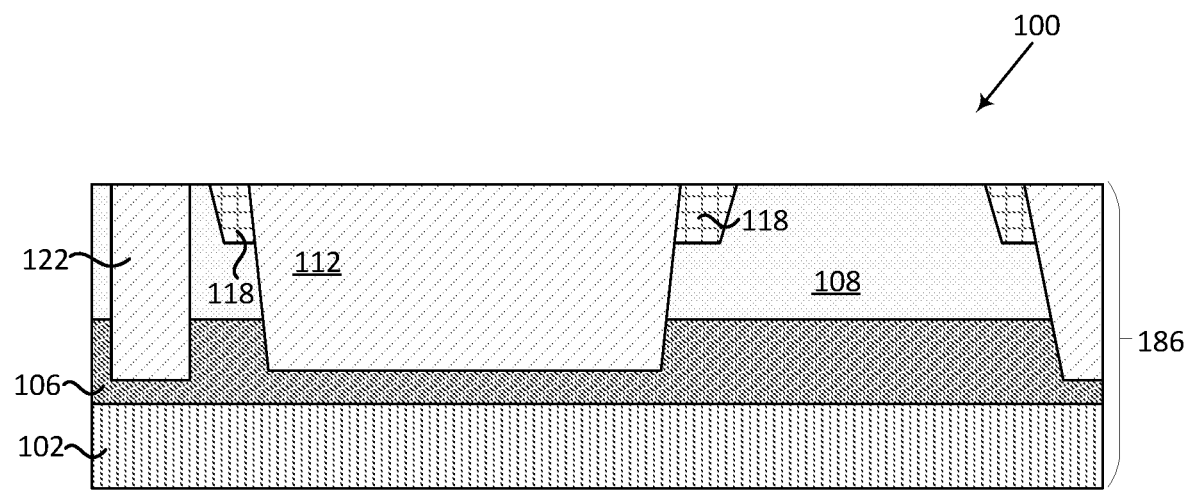

FIG. 5 is a partially completed semiconductor device 100 after the formation of a first isolation region 112 and a third isolation region 122, according to an embodiment of the disclosure. In an embodiment, the first isolation region 112 and the third isolation region 122 may be deep trench isolation (DTI) regions. Referring to FIG. 5, an upper portion of the first isolation region 112 is formed in the second isolation region 118 and a lower portion of the first isolation region 112 extends through the active layer 108 and a portion of the insulating layer 106. The third isolation region 122 is formed in the active layer 108 and a portion of the insulating layer 106. The formation of the first and third isolation regions 112 and 122, respectively, may include depositing a layer of suitable dielectric material, for example silicon dioxide, in the openings 208 and 210, respectively, by a suitable deposition process, for example atomic layer deposition (ALD), chemical vapor deposition (CVD), physical vapor deposition (PVD), or any other suitable deposition processes. A suitable planarization process, for example chemical mechanical planarization (CMP), may be used to remove a portion of the silicon dioxide layer from a top surface of the second isolation region 118 to leave behind another portion of the silicon dioxide layer in the opening 208 thereby forming the first isolation region 112. Similarly, a suitable planarization process, for example chemical mechanical planarization (CMP), may be used to remove a portion of the silicon dioxide layer from a top surface of the active layer 108 to leave behind another portion of the silicon dioxide layer in the opening 210 thereby forming the third isolation region 122. The upper portion of the first isolation region 112 is formed in the second isolation region 118 thereby leading to a compact semiconductor device 100 as the first isolation region 112 does not consume additional lateral area in the active layer 108 of the substrate 186.

Figure 6:
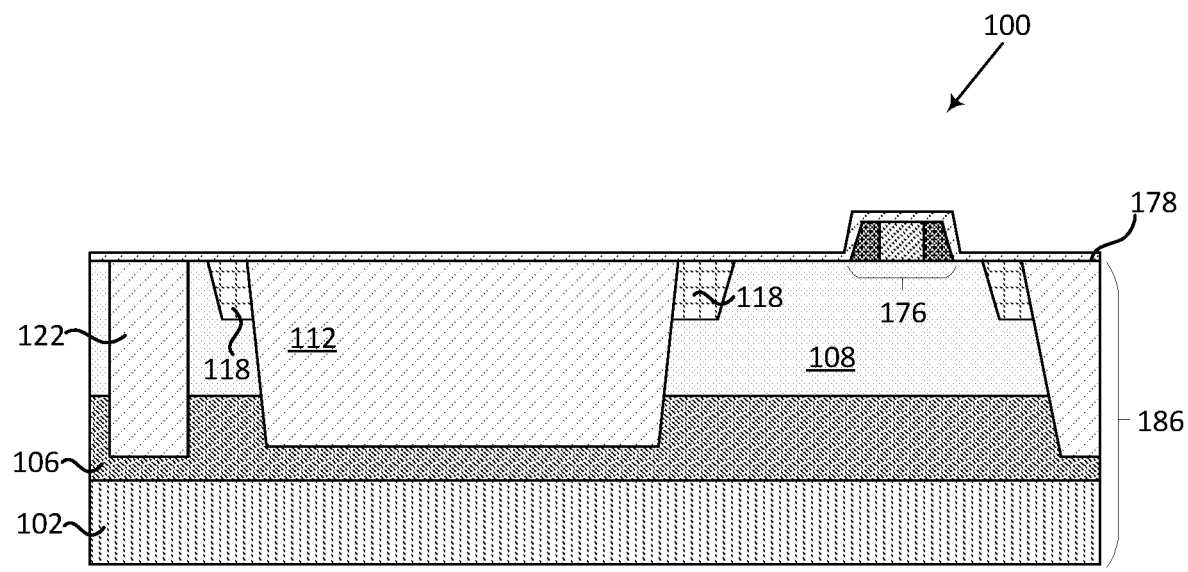

FIG. 6 is a partially completed semiconductor device 100 after formation of a gate structure 176 over the active layer 108 and a dielectric liner 178, according to an embodiment of the disclosure. The formation of the gate structure 176 is well known in the art and will not be further elaborated upon. Although not shown, doped semiconductor regions may be formed in the active layer 108 to form a source and a drain adjacent to the gate structure 176. The formation of a dielectric liner 178 may include depositing a layer of suitable dielectric material, for example silicon nitride ($Si_3N_4$), over a top surface of the active layer 108, over a top surface of the third and first isolation (DTI) region 122 and 112, respectively, over a top surface of the second isolation region 118 and over the gate structure 176 by a suitable deposition process, for example atomic layer deposition (ALD), chemical vapor deposition (CVD), physical vapor deposition (PVD), or any other suitable deposition processes to thereby form the dielectric liner 178. The dielectric liner 178 may function as an etch stop layer, to stop an etching removal process of overlying layers.

Figure 7:
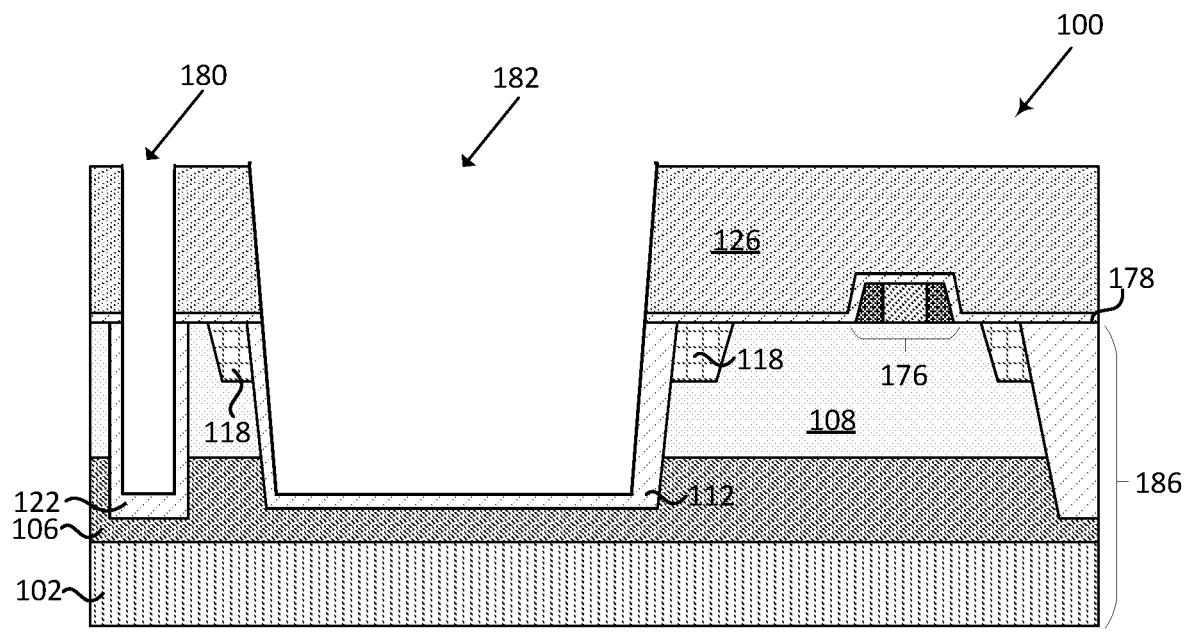

FIG. 7 is a partially completed semiconductor device 100 after formation of a dielectric layer 126 and openings 180 and 182, according to an embodiment of the disclosure. In one embodiment, the dielectric layer 126 may be inter layer dielectric (ILD) layer. Referring to FIG. 7, the dielectric layer 126 may be formed over the dielectric liner 178. The formation of the dielectric layer 126 may include depositing a layer of a suitable dielectric material, for example silicon dioxide, over the dielectric liner 178 by a suitable deposition process, for example atomic layer deposition (ALD), chemical vapor deposition (CVD), physical vapor deposition (PVD), or any other suitable deposition processes to thereby form the dielectric layer 126. An opening 180 may be formed in the dielectric layer 126, in the dielectric liner 178 and in the third isolation region 122. An opening 182 may be formed in the dielectric layer 126, in the dielectric liner 178 and in the first isolation region 112. The formation of the openings 180 and 182 may include deposition and patterning of a layer of photoresist by a conventional photolithography process to form a suitable photoresist pattern. A wet etch or dry etch process may be used to remove a portion of the dielectric layer 126, a portion of the dielectric liner 178 and a portion of the third isolation region 122 not covered by the photoresist pattern to thereby form the opening 180. The photoresist layer may subsequently be removed. Similarly, a wet etch or dry etch process may be used to remove a portion of the dielectric layer 126, a portion of the dielectric liner 178 and a portion of the first isolation region 112 to thereby form the opening 182.

Figure 8:
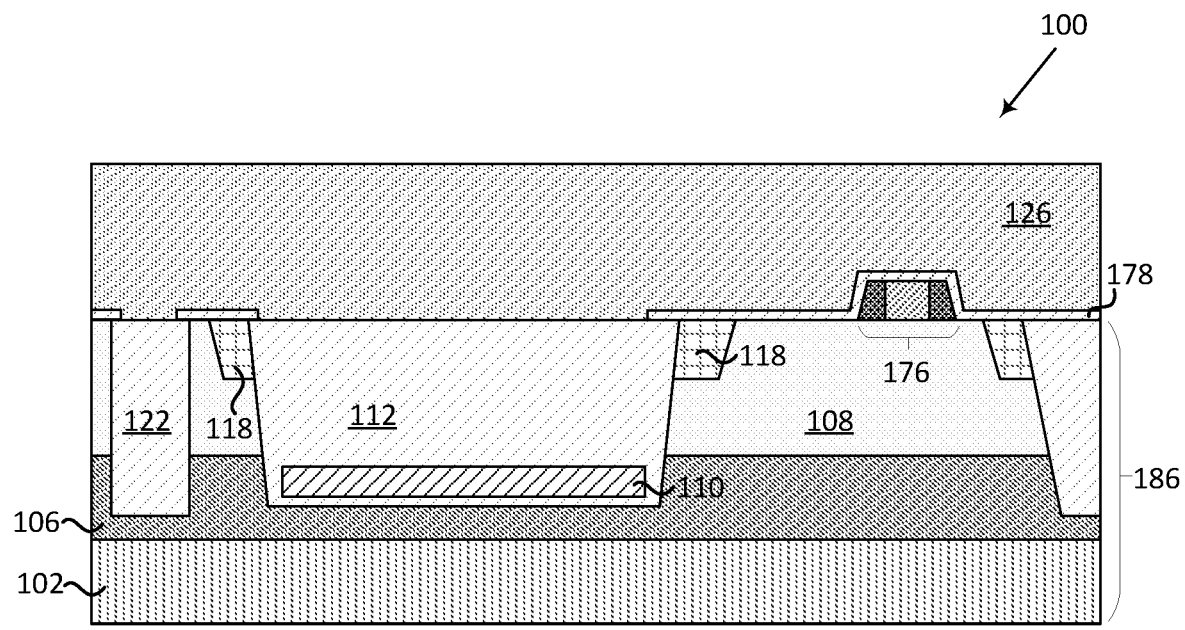

FIG. 8 is a partially completed semiconductor device 100 after formation of a first conductive layer 110, third and first isolation regions 122 and 112, respectively, and the dielectric layer 126, according to an embodiment of the disclosure. Referring to FIG. 8, the formation of the first conductive layer 110 may include depositing a layer of a suitable conductive material, for example aluminum (Al), tungsten (W), titanium nitride (TiN), cobalt (Co), or any other suitable conductive material in the opening 182 over a lower portion of the first isolation region 112 by a suitable deposition process, for example atomic layer deposition (ALD), chemical vapor deposition (CVD), physical vapor deposition (PVD), or any other suitable deposition processes. A layer of photoresist may be deposited over the aluminum layer and patterned by a conventional photolithography process to form a suitable photoresist pattern. A wet etch or dry etch process may be used to remove a portion of the aluminum layer not covered by the photoresist pattern leaving behind another portion of the aluminum layer over the lower portion of the first isolation region 112 thereby forming the first conductive layer 110. The photoresist pattern may subsequently be removed. The formation of third and first isolation regions 122 and 112, respectively, and the dielectric layer 126 may include depositing a layer of suitable dielectric material, for example silicon dioxide, in the opening 180 and in the opening 182 over the first conductive layer 110 by a suitable deposition process, for example atomic layer deposition (ALD), chemical vapor deposition (CVD), physical vapor deposition (PVD), or any other suitable deposition processes. A suitable planarization process, for example chemical mechanical planarization (CMP) may be used to remove a portion of the silicon dioxide layer from a top surface of the dielectric layer 126 leaving behind another portion of the silicon dioxide layer in the openings 180 and 182 to thereby form the third and first isolation regions 122 and 112, respectively, and a portion of the dielectric layer 126 over the third and first isolation regions 122 and 112, respectively.

Figure 9:
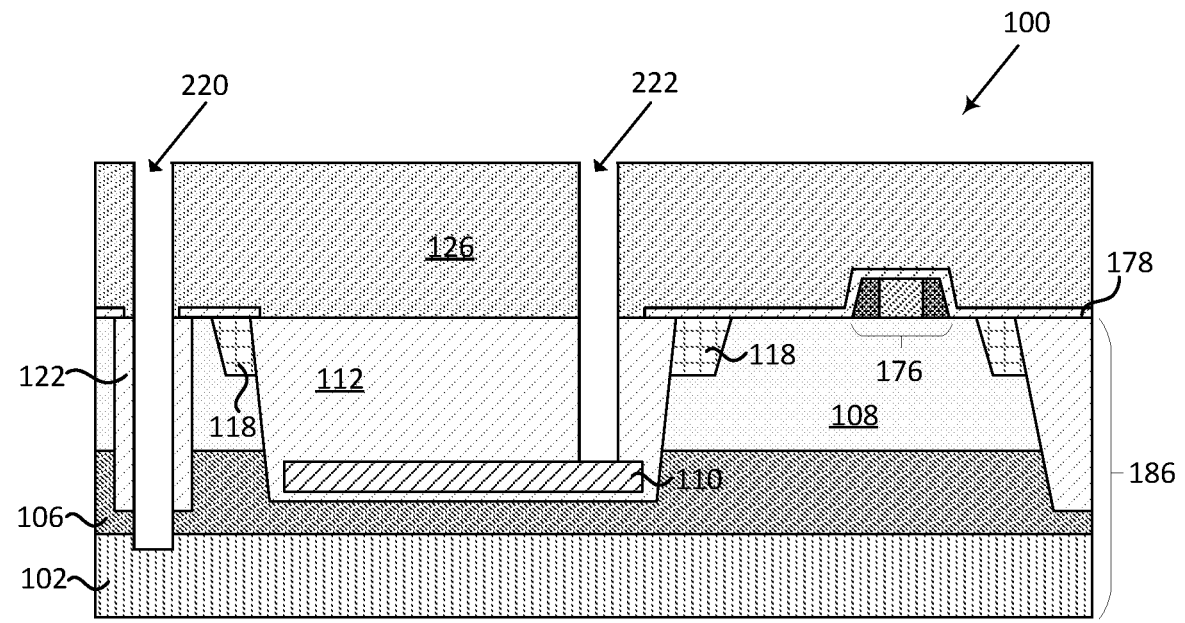

FIG. 9 is a partially completed semiconductor device 100 after formation of openings 220 and 222, according to an embodiment of the disclosure. Referring to FIG. 9, the opening 220 extends through the dielectric layer 126, the third isolation region 122, the insulating layer 106 and an upper portion of the base layer 102. The opening 222 extends through the dielectric layer 126 and a portion of the first isolation region 112 to expose a portion of the first conductive layer 110. The formation of the openings 220 and 222 may include depositing a layer of photoresist over the dielectric layer 126 and patterning the deposited photoresist layer by a conventional photolithography process to form a suitable photoresist pattern. A wet etch or dry etch process may be used to remove a portion of the dielectric layer 126, a portion of the third isolation region 122, a portion of the insulating layer 106 and a portion of the base layer 102 not covered by the photoresist pattern to thereby form the opening 220. Similarly, a wet etch or dry etch process may be used to remove a portion of the dielectric layer 126 and a portion of the first isolation region 112 over the first conductive layer 110 not covered by the photoresist pattern to thereby form the opening 222. The photoresist pattern may subsequently be removed.

Figure 10:
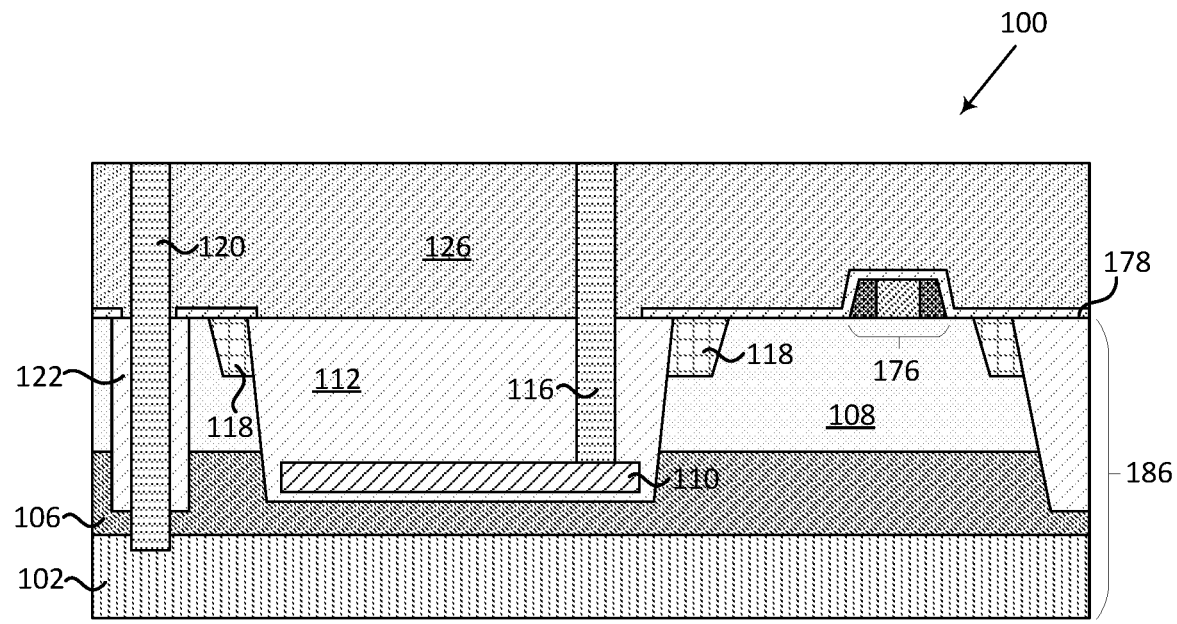

FIG. 10 is a partially completed semiconductor device 100 after formation of contact pillars 116 and 120, according to an embodiment of the disclosure. Referring to FIG. 10, the contact pillar 116 may extend through the dielectric layer 126 and a portion of the first isolation region 112 to contact the first conductive layer 110. The contact pillar 120 may extend through the dielectric layer 126, the third isolation region 122, the insulating layer 106 and an upper portion of the base layer 102. The contact pillars 116 and 120 may be formed by depositing a layer of a suitable conductive material, for example tungsten (W), or any other suitable conductive material in the openings 220 and 222 by a suitable deposition method, for example atomic layer deposition (ALD), chemical vapor deposition (CVD), physical vapor deposition (PVD), or any other suitable deposition processes. A suitable planarization process, for example chemical mechanical planarization (CMP), may be used to remove a portion of the tungsten layer from a top surface of the dielectric layer 126 to leave behind another portion of the tungsten layer in the openings 220 and 222 thereby form the contact pillars 120 and 116, respectively. Although not shown, in one embodiment, a second conductive layer 162 of the decoupling capacitor 300 may be formed over the contact pillar 116 and the dielectric layer 126.

Figure 11:
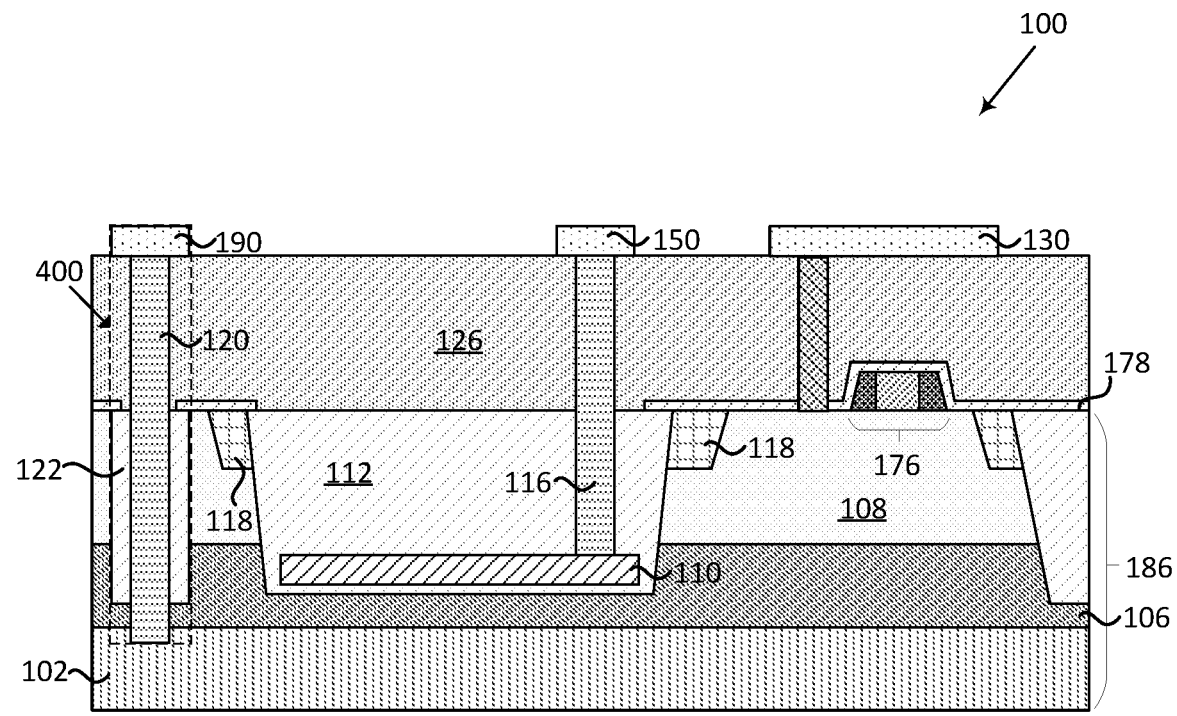

FIG. 11 is a partially completed semiconductor device 100 after formation of metallization layers 150 and 190 over the contact pillars 116 and 120, respectively, according to an embodiment of the disclosure. Referring to FIG. 11, the formation of the metallization layer 150 may include depositing a layer of photoresist over the dielectric layer 126 and over the contact pillars 116. A conventional photolithography process may be used to pattern the photoresist layer to form an opening over the contact pillar 116. A layer of a suitable conductive material, for example copper (Cu), aluminum (Al) or any other suitable conductive material, may be deposited in the opening over the contact pillar 116 by a suitable deposition process, for example electroplating, chemical vapor deposition (CVD), physical vapor deposition (PVD), or any other suitable deposition processes. The photoresist layer may be removed in a lift-off process to leave behind a portion of the copper layer over the contact pillar 116 thereby forming the metallization layer 150. The metallization layer 190 and a metallization layer 130 over the gate structure 176 may also be formed by a conventional photolithography process, conductive layer deposition followed by a lift-off process similar to the formation of the metallization layer 150.

Referring back to FIG. 1, a semiconductor device 100 is shown after the formation of dielectric layers 128, 132, 136 and 138, contact pillars 152, 158, 188, 140, 146, 184 and 166, metallization layers 156, 160, 142, 148, a second conductive layer 162 and bond pads 168, 170 and 172, according to an embodiment of the disclosure. Referring to FIG. 1, a dielectric layer 128 may be formed over the metallization layers 150, 130 and 190 and over the dielectric layer 126. In one embodiment, the dielectric layer 128 may be inter metal dielectric (IMD) layer. A contact pillar 152 may be formed in the dielectric layer 128 and over the metallization layer 150. A contact pillar 140 may be formed in the dielectric layer 128 and over the metallization layer 130. The formation of the contact pillars 152 and 140 may include forming an opening in the dielectric layer 128 over the metallization layer 150 and 130, respectively. A suitable conductive material, for example tungsten or any other suitable conductive material may be deposited into the opening. A suitable planarization process, for example chemical mechanical planarization, may be used to remove tungsten from a top surface of the dielectric layer 128 to leave behind another layer of tungsten in the opening over the metallization layer 150 and 130 thereby forming the contact pillars 152 and 140, respectively. Metallization layers 156 and 142 may be formed over the contact pillars 152 and 140, respectively. A dielectric layer 132 may be formed over the dielectric layer 128 and over the metallization layers 156 and 142. In one embodiment, the dielectric layer 132 may be inter metal dielectric (IMD) layer. A contact pillar 158 may be formed in the dielectric layer 132 and over the metallization layer 156. A contact pillar 146 may be formed in the dielectric layer 132 over the metallization layer 142. The formation of the contact pillars 158 and 146 may include forming an opening in the dielectric layer 132 over the metallization layers 156 and 142, respectively. A suitable conductive material, for example tungsten or any other suitable conductive material may be deposited into the opening. A suitable planarization process, for example chemical mechanical planarization, may be used to remove tungsten from a top surface of the dielectric layer 132 to leave behind another layer of tungsten in the opening over the metallization layer 156 and 142, thereby forming the contact pillars 158 and 146, respectively.

Metallization layers 160 and 148 may be formed over the contact pillars 158 and 146, respectively. A second conductive layer 162 of a decoupling capacitor 300 may be formed over a portion of the first isolation region 112 above the first conductive layer 110, over the dielectric layers 126, 128 and 132. The metallization layers 160 and 148 and the second conductive layer 162 of the decoupling capacitor 300 may be made of the same conductive material. A dielectric layer 136 may be formed over the second conductive layer 162 and over the metallization layers 160 and 148. In one embodiment, the dielectric layer 136 may be inter metal dielectric (IMD) layer. Contact pillars 166, 188 and 184 may be formed in the dielectric layer 136 over the second conductive layer 162 of the decoupling capacitor 300 and over the metallization layers 160 and 148. The formation of the contact pillars 166, 188 and 184 may include forming an opening in the dielectric layer 136 over the second conductive layer 162 and the metallization layers 160 and 148, respectively. A suitable conductive material, for example tungsten or any other suitable conductive material may be deposited into the opening. A suitable planarization process, for example chemical mechanical planarization, may be used to remove tungsten from a top surface of the dielectric layer 136 to leave behind another layer of tungsten in the opening over the second conductive layer 162 and the metallization layers 160 and 148, respectively, thereby forming the contact pillars 166, 188 and 184, respectively. Bond pads 168, 170 and 172 may be formed over the contact pillars 166, 188 and 184, respectively. The formation of the bond pads 168, 170 and 172 may include a conventional photolithography process, conductive layer deposition followed by a lift-off process similar to the formation of the second conductive layer 162 and the metallization layers 160 and 148. A dielectric layer 138 may be formed over the bond pads 168, 170 and 172. Openings may be formed in the dielectric layer 138 to expose the bond pads 168, 170 and 172. In one embodiment, the contact pillars 140, 146 and 184 and the metallization layers 130, 142 and 148 may be used for connecting the gate structure 176 to an input or output terminal.

The dielectric layers 128, 132, 136 and 138 may be made of the same dielectric material as the dielectric layer 126 and deposited using the same deposition process. In one embodiment, the metallization layers 156, 142, 160 and 148 and the second conductive layer 162 of the decoupling capacitor 300 may be made of the same conductive material as the metallization layers 150, 130 and 190 and fabricated using the same deposition and patterning processes. In another embodiment, the second conductive layer 162 of the decoupling capacitor 300 may be made of a different conductive material from the metallization layers 150, 130, 190, 156, 142, 160 and 148.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:
1. A capacitor comprising:
  a first conductive layer in a first isolation region in a substrate;
  a plurality of dielectric layers over the first isolation region;
  a first interconnect over the first conductive layer, wherein the first interconnect extends through a portion of the first isolation region over the first conductive layer and through the plurality of dielectric layers to couple to a first bond pad; and a second conductive layer over the plurality of dielectric layers, wherein the second conductive layer at least partially overlaps with the first conductive layer.

2. The capacitor of claim 1, wherein the substrate comprises an insulating layer and an active layer over the insulating layer and the first isolation region extends through the active layer and an upper portion of the insulating layer.

3. The capacitor of claim 1, wherein the first conductive layer is arranged in a lower portion of the first isolation region.

4. The capacitor of claim 1, wherein the first conductive layer is arranged over a bottom surface of the first isolation region.

5. The capacitor of claim 1, wherein the plurality of dielectric layers comprise inter layer dielectric (ILD) and inter metal dielectric (WED) layers.

6. The capacitor of claim 1, wherein the first conductive layer is arranged in an upper portion of the first isolation region.

7. The capacitor of claim 1, further comprising:
a second interconnect over the second conductive layer, wherein the second interconnect extends through a dielectric layer to couple to a second bond pad.

8. The capacitor of claim 7, wherein the second interconnect comprises a contact pillar.

9. The capacitor of claim 1, wherein the first interconnect comprises a plurality of contact pillars and metallization layers.

10. The capacitor of claim 1, wherein the second conductive layer completely overlaps with the first conductive layer.

11. A semiconductor device comprising:
a substrate comprising an insulating layer and an active layer over the insulating layer;
a first isolation region in the active layer and in the insulating layer;
a second isolation region in the active layer laterally adjacent to an upper portion of the first isolation region; and
a capacitor having a first conductive layer in the first isolation region, wherein the first conductive layer is a bottom plate of the capacitor, a plurality of dielectric layers over the first isolation region, a second conductive layer over the plurality of dielectric layers, wherein the second conductive layer is a top plate of the capacitor and the second conductive layer at least partially overlaps with the first conductive layer.

12. The semiconductor device of claim 11, wherein the second isolation region is shallower than the first isolation region.

13. The semiconductor device of claim 11, wherein the capacitor further comprises:
a first interconnect over the first conductive layer, wherein the first interconnect extends through a portion of the first isolation region over the first conductive layer and through the plurality of dielectric layers to couple to a first bond pad.

14. The semiconductor device of claim 13, wherein the capacitor further comprises:

a second interconnect over the second conductive layer, wherein the second interconnect is coupled to a second bond pad.

15. The semiconductor device of claim 11, wherein the plurality of dielectric layers include inter layer dielectric (ILD) and inter metal dielectric (IMD) layers.

16. The semiconductor device of claim 11, wherein the substrate further comprises a base layer; and
a lower portion of the first isolation region and a lower portion of the insulating layer are between the first conductive layer of the capacitor and the base layer of the substrate.

17. The semiconductor device of claim 16 further comprising:
a third interconnect extending from the base layer through the insulating layer and the active layer, wherein the third interconnect is coupled to a ground terminal.

18. A method of fabricating a semiconductor device comprising:
providing a substrate comprising an insulating layer and an active layer over the insulating layer;
providing a first isolation region in the insulating layer and the active layer;
providing a second isolation region in the active layer, wherein the second isolation region is laterally adjacent to an upper portion of the first isolation region; and
providing a capacitor comprising a first conductive layer in the first isolation region, and a plurality of dielectric layers over the first isolation region, a second conductive layer over the plurality of dielectric layers, wherein the second conductive layer at least partially overlaps with the first conductive layer.

19. The method of fabricating a semiconductor device of claim 18, wherein providing a second isolation region in the active layer further comprises:
forming an opening in the active layer;
forming a layer of dielectric material in the opening to form a second isolation region in the active layer;
forming an opening in the second isolation region, in the active layer and in the insulating layer; and
forming an isolation layer material in the opening to form a first isolation region in the active layer and in the insulating layer, wherein the second isolation region is laterally adjacent to an upper portion of the first isolation region.

20. The method of fabricating a semiconductor device of claim 19, wherein providing a capacitor further comprises:
forming an opening in the first isolation region and forming a first conductive layer in the opening in the first isolation region;
forming an isolation layer material over the first conductive layer to form the first conductive layer in the first isolation region;
forming a plurality of dielectric layers over the first isolation region; and
forming a second conductive layer over the plurality of dielectric layers, wherein the second conductive layer at least partially overlaps with the first conductive layer.

* * * * *